United States Patent

Nakagawa

Patent Number: 5,313,093
Date of Patent: May 17, 1994

[54] COMPOUND SEMICONDUCTOR DEVICE

[75] Inventor: Yoshikazu Nakagawa, Kyoto, Japan

[73] Assignee: Rohm Co., Ltd., Kyoto, Japan

[21] Appl. No.: 929,883

[22] Filed: Aug. 11, 1992

[30] Foreign Application Priority Data

Oct. 29, 1991 [JP] Japan .................................. 3-311828
Oct. 29, 1991 [JP] Japan .................................. 3-311829

[51] Int. Cl.$^5$ .......................................... H01L 29/161
[52] U.S. Cl. .................................... 257/194; 257/281; 257/284; 257/285; 257/472
[58] Field of Search ............... 257/194, 281, 284, 285, 257/472

[56] References Cited

U.S. PATENT DOCUMENTS 5,043,777  8/1991  Sriram .................................. 257/194

Primary Examiner—Edward Wojciechowicz
Attorney, Agent, or Firm—Brumbaugh, Graves, Donohue & Raymond

[57] ABSTRACT

A compound semiconductor device includes an undoped semiconductor layer; a doped semiconductor layer formed on the undoped semiconductor layer and having smaller electron affinity than the undoped semiconductor layer; a gate electrode formed on the doped semiconductor layer; a cap layer formed on the doped semiconductor layer; and a source electrode and a drain electrode respectively formed on the cap layer. In the device, an undoped-material layer having greater electron affinity than the doped semiconductor layer and the cap layer, is formed between the doped semiconductor layer and the cap layer. A layer which has the same composition and impurities as those of the doped semiconductor layer and whose impurity concentration is sufficiently higher than an impurity concentration of the doped semiconductor layer may, be provided between the doped semiconductor layer and the cap layer.

5 Claims, 3 Drawing Sheets

FIG. 1 PRIOR ART
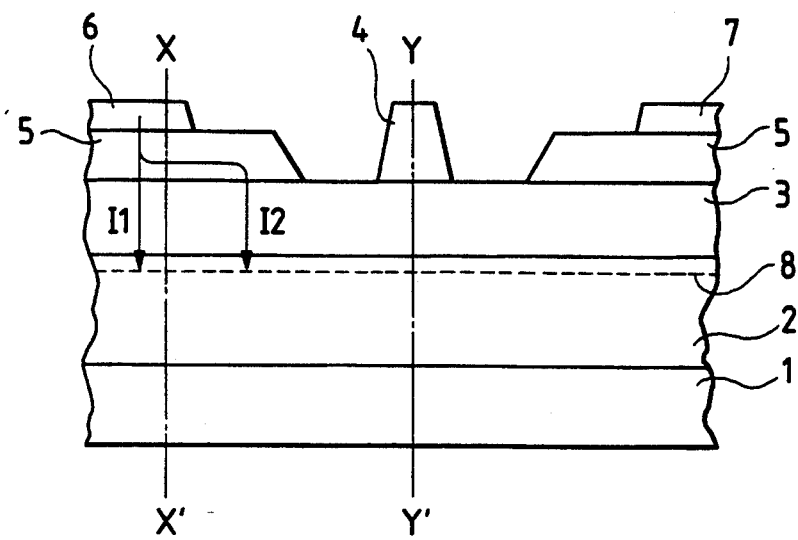
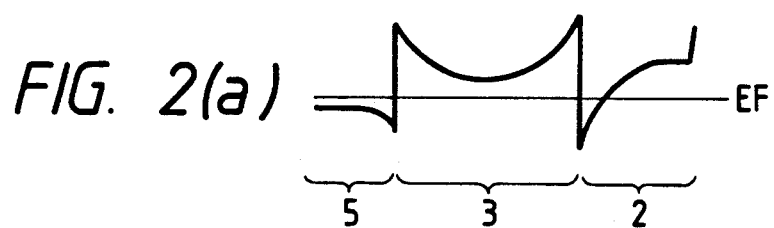
FIG. 2(a)
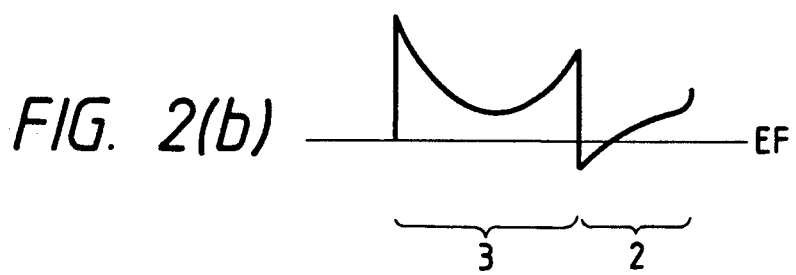
FIG. 2(b)

COMPOUND SEMICONDUCTOR DEVICE

BACKGROUND OF THE INVENTION

The present invention relate to a compound semiconductor device such as a HEMT (High Electron Mobility Transistor).

A HEMT structure is attracting attention as a field-effect transistor making use of a two-dimensional electron gas accumulated in a heterojunction interface. As shown in FIG. 1, this HEMT structure comprises an undoped semiconductor layer 2 disposed on a substrate 1; a doped semiconductor layer 3 whose electron affinity is smaller than that of the undoped semiconductor layer 2 and in which impurities are doped; a gate electrode 4 formed on the doped semiconductor layer; and a source electrode 6 and a drain electrode 7 which are respectively formed on a cap layer 5 provided on the doped semiconductor layer at both sides of the gate electrode 4. In this HEMT structure, all the donor impurities added to the doped semiconductor layer 3 having smaller electron affinity are ionized, and electrons resulting from this ionization are accumulated in a heterojunction interface with respect to the undoped semiconductor layer 2 having greater electron affinity, thereby forming a two-dimensional electron gas 8.

This two-dimensional electron gas 8 can be controlled by application of a voltage to the gate electrode 4, so that a current flowing across the source and the drain can be controlled. At that time, the current flowing from the source passes through a plurality of passages, as shown at I1 and I2, to the two-dimensional electron gas 8.

FIG. 2 shows energy bands, in which FIG. 2(a) and FIG. 2(b) are energy band diagrams of a cross section taken along line X—X' and of a cross section taken along line Y—Y', respectively. It should be noted that, in these drawings, EF denotes the Fermi level.

Since the doped semiconductor layer 3 is in a completely ionized state, electrons must pass between the cap layer 5 and the two-dimensional electron gas 8, i.e., though the completely ionized doped semiconductor layer 3, by means of the tunneling effect. For that reason, there have been drawbacks in that the source resistance becomes very large, and that the noise characteristic particularly in a high-frequency band is degraded.

SUMMARY OF THE INVENTION

The present invention has been made in view of these points, and has an object to provide a compound semiconductor device of a HEMT structure in which the source resistance is reduced and the noise characteristic is thereby improved.

To attain the aforementioned object, according to a first aspect of the present invention, there is provided a compound semiconductor device comprising: an undoped semiconductor layer; a doped semiconductor layer formed on the undoped semiconductor layer and having smaller electron affinity than the undoped semiconductor layer, impurities being doped in the doped semiconductor layer; a gate electrode formed on the doped semiconductor layer; a cap layer formed on the doped semiconductor layer at both sides of the gate electrode and a source electrode and a drain electrode respectively formed on the cap layer, wherein an undoped-material layer, having greater electron affinity than the doped semiconductor layer and the cap layer, is formed between the doped semiconductor layer and the cap layer.

In accordance with this arrangement, the overall potential of the energy bands in a cross section on the source side including the cap layer is lowered. For that reason, the doped semiconductor layer is not completely ionized, and electrons remain in a central portion of the doped semiconductor layer. Correspondingly, it becomes easy for electrons to pass through the doped semiconductor layer, and the source resistance lowers.

According to a second aspect of the present invention, there is provided a compound semiconductor device comprising: an undoped semiconductor layer; a doped semiconductor layer formed on the undoped semiconductor layer and having smaller electron affinity than the undoped semiconductor layer, impurities being doped in the doped semiconductor layer; a gate electrode formed on the doped semiconductor layer; a cap layer formed on the doped semiconductor layer at both sides of the gate electrode; and a source electrode and a drain electrode respectively formed on the cap layer, wherein a layer which has the same composition and impurities as those of the doped semiconductor layer and whose impurity concentration is sufficiently higher than an impurity concentration of the doped semiconductor layer is provided between the doped semiconductor layer and the cap layer.

In addition, according to a third aspect of the present invention, an arrangement may be provided such that a layer which has the same composition and impurities as those of the doped semiconductor layer and whose impurity concentration is substantially identical with an impurity concentration of the doped semiconductor layer is provided between the doped semiconductor layer and the cap layer, and a planar-doped layer of a high concentration is provided in the vicinity of a center of that layer.

Since the newly provided layer mentioned above includes impurities of a high concentration, the potential of this layer drops, with the result that the potential of the doped semiconductor layer also drops. Then, in the vicinity of the center of the doped semiconductor layer is not completely depleted, and electrons remain therein. For that reason, the passage of the electrons through this doped semiconductor layer is facilitated, so that a resistance value on the source side in the HEMT declines correspondingly, thereby improving the noise characteristic.

BRIEF DESCRIPTION OF THE DRAWINGS

FIG. 1 is a diagram of a HEMT structure of the prior art;

FIGS. 2(a) and 2(b) are energy band diagrams in cross sections of the HEMT structure shown in FIG. 1 taken along line X—X' and along line Y—Y' respectively;

DETAILED DESCRIPTION OF THE PREFERRED EMBODIMENTS

Figure 3:
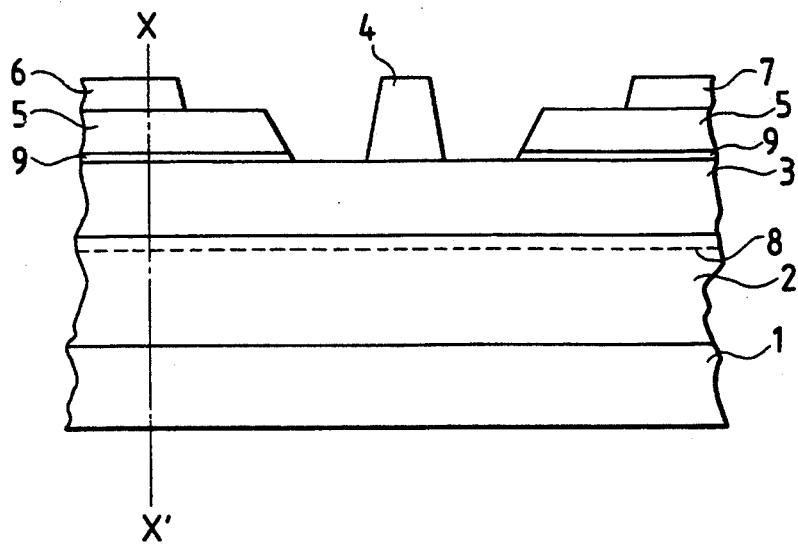
FIG. 3 is a diagram of the structure of a compound semiconductor device of a HEMT structure to which the present invention is applied.

In FIG. 3 in which a first embodiment of the present invention is implemented, a noticeable difference from the prior art shown in FIG. 1 lies in that a new layer 9 is disposed between a cap layer 5 and a doped semiconductor layer 3. This layer 9 is made of a material having greater electron affinity than the doped semiconductor layer 3 and the cap layer 5, is formed with a very small thickness, and is formed as an undoped layer. This layer 9 is formed of, for example, an undoped InGaAs layer with a thickness of several dozens angstroms.

Here, the reason for forming the layer 9 with a small thickness is that if it is thick, the crystal lattice constant becomes large, making it difficult to form the layer 9. Accordingly, if the layer 9 can be formed easily even if it is relatively thick, the layer 9 need not be formed with a small thickness. In FIG. 3, materials of the other layers are, for example, as follows: an undoped semiconductor layer 2 is formed of GaAs or InGaAs; the doped semiconductor layer 3 is formed of n+ AlGaAs; and the cap layer 5 is formed of GaAs.

Figure 4:
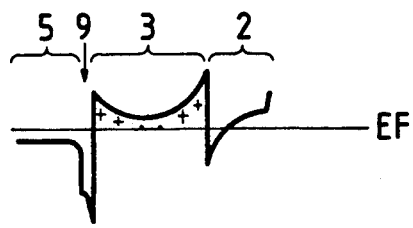
FIG. 4 is an energy band diagram in a cross section taken along line X—X' of the device of FIG. 3 according to a first embodiment.

If the aforementioned layer 9 is formed, the overall potential of the energy band in the cross section taken along line X—X' in FIG. 3, is lowered as shown in FIG. 4, and the doped semiconductor layer 3 is not completely ionized, so that electrons exist in the vicinity of the center thereof. For this reason, the passing of the electrons through this doped semiconductor layer 3 is facilitated, and the source-side resistance is reduced correspondingly.

Figure 5:
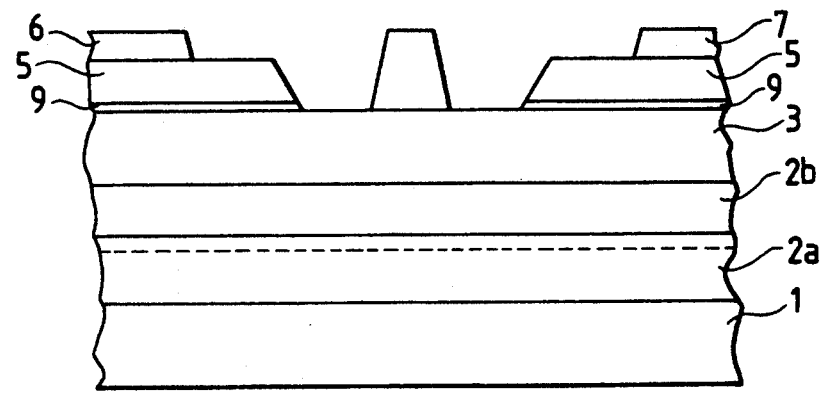
FIG. 5 is a diagram of the structure of a device according to a second embodiment of the present invention.

FIG. 5 shows a second embodiment in which the aforementioned layer 9 is provided in a HEMT in which two undoped semiconductor layers 2a and 2b are provided instead of a single undoped semiconductor layer. A similar effect is produced in this case as well. In FIG. 5, for instance, the undoped semiconductor layer 2a is formed of InGaAs, while the undoped semiconductor layer 2b is formed of AlGaAs. Furthermore, a buffer layer formed of GaAs may be interposed between a substrate 1 and the undoped semiconductor layer 2a.

According to a third embodiment of the present invention, the structure of a compound semiconductor device is the same as that shown in FIG. 3. However, according to the third embodiment, the layer 9 has the same composition as the doped semiconductor layer 3 and its impurities are the same, but the concentration of the impurities is sufficiently higher than the impurity concentration of the doped semiconductor layer 3.

According to the third embodiment, the newly provided layer 9 is formed of AlGaAs of a high impurity concentration. It should be noted that also in this embodiment, the undoped semiconductor layer 2 may be formed of a two-layered structure comprising the InGaAs layer 2a and the AlGaAs layer 2b as shown in FIG. 5. In addition, a buffer layer of GaAs may be added between the substrate 1 and the undoped semiconductor layer 2.

Figure 6:
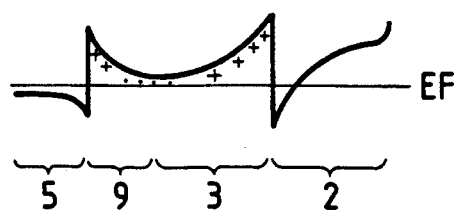
FIG. 6 is an energy band diagram in a cross section taken along line X—X' of the device shown in FIG. 3 according to a third embodiment.

Since the layer 9 is provided according to the third embodiment, the potential of an energy band in a cross section taken along line X—X' of FIG. 3 drops in the portion of the layer 9, as shown in FIG. 6, so that the potential in the vicinity of the center of the doped semiconductor layer 3 also drops together with the decrease of the former potential, causing electrons to remain in the doped semiconductor layer 3. For this reason, the electrons which advance from the cap layer 5 side to the undoped layer 2 side can easily pass through the doped semiconductor layer 3. This means that the resistance on the source side is lowered.

An noise figure is given by $$NF = 1 + K(f/fT)\sqrt{\{gm(Rs+Rg)\}}$$

In this formula, K is a fitting constant; f, a frequency; fT, a cutoff frequency; gm, a mutual conductance; Rs, a source resistance; and Rg, a gate resistance.

As can be seen from this formula, the noise is reduced in the HEMT having a small source resistance Rs as in the above-described embodiments.

Figure 7:
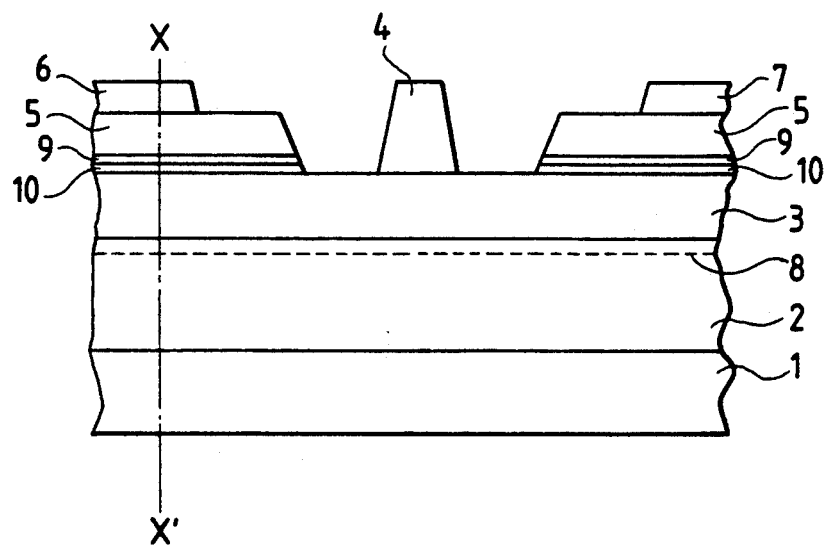
FIG. 7 is a diagram of the structure of a device according to a fourth embodiment of the present invention.

Next, in a fourth embodiment shown in FIG. 7, the layer 9 is arranged to have the same composition and impurities as those of the doped semiconductor layer 3, and further the concentration of the impurities of the layer 9 is set to be substantially identical with that of the doped semiconductor layer 3. However, a planar-doped layer 10 having the same impurities and a high concentration is disposed in the vicinity of the center of the layer 9. The arrangements of the other portions are the same as those of FIG. 3.

Figure 8:
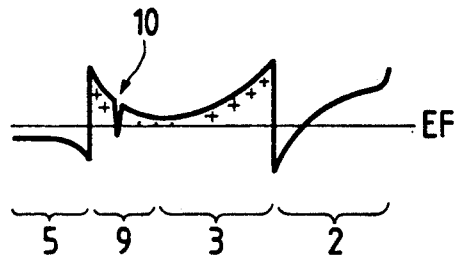
FIG. 8 is an energy band diagram in a cross section taken along line X—X' of the device shown in FIG. 7.

According to the fourth embodiment, the energy band in a cross section taken along line X—X' of FIG. 7 becomes such as the one shown in FIG. 8, in which a portion whose potential drops sharply by the planar-doped layer 10, exists in the layer 9. As a result, the potential of the doped semiconductor layer 3 also drops, and electrons exist in the vicinity of the center thereof. Thus, in the same way as described in connection with the former embodiments shown in FIG. 3, the source resistance drops, and the noise figure is lowered.

As described above, in accordance with the compound semiconductor device of the present invention, advantages are obtained in that the source resistance becomes small, and that the noise figure is improved.

What is claimed is:

1. A compound semiconductor device, comprising:
   an undoped semiconductor layer;
   a doped semiconductor layer formed on said undoped semiconductor layer and having smaller electron affinity than said undoped semiconductor layer, impurities being doped in said doped semiconductor layer;
   a gate electrode formed on said doped semi-conductor layer;
   a cap layer formed on said doped semiconductor layer; and
   a source electrode and a drain electrode formed on said cap layer;
   and a source resistance decreasing layer comprising an undoped semiconductor material layer having greater electron affinity than said doped semiconductor layer and said cap layer for decreasing a source resistance of said compound semiconductor device by making electrons remain in a center portion of said doped semiconductor layer formed between said doped semiconductor layer and said cap layer.

2. A compound semiconductor device as claimed in claim 1, wherein said source resistance decreasing layer has a thickness of several dozens angstroms.

3. A compound semiconductor device comprising:
an undoped semiconductor layer;
a doped semiconductor layer formed on said undoped semiconductor layer and having smaller electron affinity than said undoped semiconductor layer, impurities being doped in said doped semiconductor layer;
a gate electrode formed on said doped semiconductor layer; and
a source electrode and a drain electrode formed on said cap layer;
and a source resistance decreasing layer formed between the doped semiconductor layer and the cap layer, wherein said undoped semiconductor layer is formed of one of an InGaAs layer and a GaAs layer, said doped semiconductor layer is formed of an n+ AlGaAs layer, said cap layer is formed of a GaAs layer, and said source resistance decreasing layer is formed of an InGaAs layer.

4. A compound semiconductor device comprising:
an undoped semiconductor layer;
a doped semiconductor layer formed on said undoped semiconductor layer and having smaller electron affinity than said undoped semiconductor layer, impurities being doped in said doped semiconductor layer;
a gate electrode formed on said doped semi-conductor layer;
a cap layer formed on said doped semiconductor layer; and
a source electrode and a drain electrode formed on said cap layer;
and a source resistance decreasing layer formed between the doped semiconductor layer and the cap layer, wherein said source resistance decreasing layer is a semiconductor layer having the same composition and impurities as those of said doped semiconductor layer, and an impurities concentration of said source resistance decreasing layer is sufficiently higher than an impurity concentration of said doped semiconductor layer.

5. A compound semiconductor device comprising:
an undoped semiconductor layer;
a doped semiconductor layer formed on said undoped semiconductor layer and having smaller electron affinity than said undoped semiconductor layer, impurities being doped in said doped semiconductor layer;
a gate electrode formed on said doped semi-conductor layer;
a cap layer formed on said doped semiconductor layer; and
a source electrode and a drain electrode formed on said cap layer;
and a source resistance decreasing layer formed between the doped semiconductor layer and the cap layer, wherein said source resistance decreasing layer comprises a first semiconductor layer having the same composition and impurities as those of said doped semiconductor layer and an impurity concentration substantially identical with an impurity concentration of said doped semiconductor layer, and a planar-doped semiconductor layer of a high impurity concentration provided in a vicinity of a center of said first semiconductor layer.

* * * * *

UNITED STATES PATENT AND TRADEMARK OFFICE
CERTIFICATE OF CORRECTION

PATENT NO. : 5,313,093

DATED : May 17, 1994

INVENTOR(S) : Yoshikazu Nakagawa

It is certified that error appears in the above-indentified patent and that said Letters Patent is hereby corrected as shown below:

Column 1, line 5, "relate" should read --relates--.

Column 5, line 14, "; and" should read --; a cap layer formed on said doped semiconductor layer; and--.

Column 6, line 8, "impurities" should read --impurity--.

Signed and Sealed this

Twentieth Day of September, 1994

Attest:

BRUCE LEHMAN

Attesting Officer

Commissioner of Patents and Trademarks